United States Patent [19]
Takaya et al.

[11] Patent Number: 5,428,885
[45] Date of Patent: Jul. 4, 1995

[54] METHOD OF MAKING A MULTILAYER HYBRID CIRCUIT

[75] Inventors: Minoru Takaya; Yoshinori Mochizuki, both of Chiba, Japan

[73] Assignee: TDK Corporation, Tokyo, Japan

[21] Appl. No.: 9,410

[22] Filed: Jan. 27, 1993

Related U.S. Application Data

[63] Continuation of Ser. No. 791,896, Nov. 13, 1991, abandoned, which is a continuation of Ser. No. 464,453, Jan. 12, 1990, abandoned.

[30] Foreign Application Priority Data

| Jan. 14, 1989 | [JP] | Japan | 1-7378 |
| Mar. 2, 1989 | [JP] | Japan | 1-50773 |
| Jul. 2, 1989 | [JP] | Japan | 1-170842 |

[51] Int. Cl.$^6$ ............................................. H01G 4/30
[52] U.S. Cl. ................................. 29/25.42; 29/602.1; 29/620; 264/61; 361/738
[58] Field of Search .............. 29/25.42, 602.1, 620; 264/61; 174/52.3, 52.4; 361/386, 388, 392, 395, 400, 401, 404, 405, 415, 417, 421, 29, 264

[56] References Cited

U.S. PATENT DOCUMENTS

| 3,346,689 | 10/1967 | Parstorfer | 361/414 |
| 3,398,232 | 8/1968 | Hoffman | 361/414 |
| 3,484,654 | 12/1969 | Hoheiser | 317/101 |
| 3,843,951 | 10/1974 | Maheux | 439/67 |
| 4,322,698 | 3/1982 | Takashi et al. | 333/184 |
| 4,328,531 | 5/1982 | Nagashima et al. | 361/414 |
| 4,342,143 | 8/1982 | Jennings | 29/25.42 |
| 4,371,744 | 2/1983 | Badet et al. | 361/409 |
| 4,437,140 | 3/1984 | Ohyama et al. | 361/402 |
| 4,501,960 | 2/1985 | Jouvet et al. | 361/401 |
| 4,535,385 | 8/1985 | August et al. | 361/388 |
| 4,620,264 | 10/1986 | Ushifusa et al. | 361/414 |
| 4,631,820 | 12/1986 | Harada et al. | 361/401 |
| 4,754,371 | 5/1988 | Nitta et al. | 361/408 |
| 4,803,595 | 2/1989 | Kraus et al. | 361/412 |
| 4,827,328 | 5/1989 | Ozawa et al. | 357/80 |
| 4,874,721 | 10/1989 | Kimura et al. | 361/414 |
| 4,890,194 | 12/1989 | Derryberry et al. | 361/386 |
| 4,922,324 | 5/1990 | Sudo | 357/74 |
| 4,922,377 | 5/1990 | Matsumoto et al. | 361/387 |

FOREIGN PATENT DOCUMENTS

| 0062345 | 5/1981 | Japan | 357/70 |
| 76455 | 7/1984 | Japan | . |
| 0175753 | 10/1984 | Japan | 357/70 |
| 0084854 | 5/1985 | Japan | 357/72 |
| 0061015 | 3/1987 | Japan | 361/395 |
| 279622 | 12/1987 | Japan | . |
| 0114697 | 4/1990 | Japan | 29/837 |
| 0281648 | 11/1990 | Japan | 357/74 |

OTHER PUBLICATIONS

IBM Technical Disclosure Bulletin, vol. 22 No. 5 Oct. 1979 "Multilayer Ceramic Fixed Layer Substrate Design" A. H. Johnson, J. E. Martyak and R. Ricci.

*Primary Examiner*—Carl E. Hall
*Attorney, Agent, or Firm*—Martin Novack

[57] ABSTRACT

A multilayer hybrid circuit, which looks like a conventional printed circuit board, has a laminated body having at least one of a plurality of dielectric layers, magnetic layers, and conductive patterns, composing a capacitor, an inductor, and a resistor, and mounts a semiconductor chip. An external connection is effected by side terminals positioned on side walls of the laminated body. In one embodiment, said laminated body and said semiconductor chip are molded together by plastics so that the result looks as if a conventional semiconductor chip. In another embodiment, a resilient relay board is coupled with the laminated body when mounted on a mother board so that stress on the mother board is not applied directly to the laminated body.

2 Claims, 11 Drawing Sheets

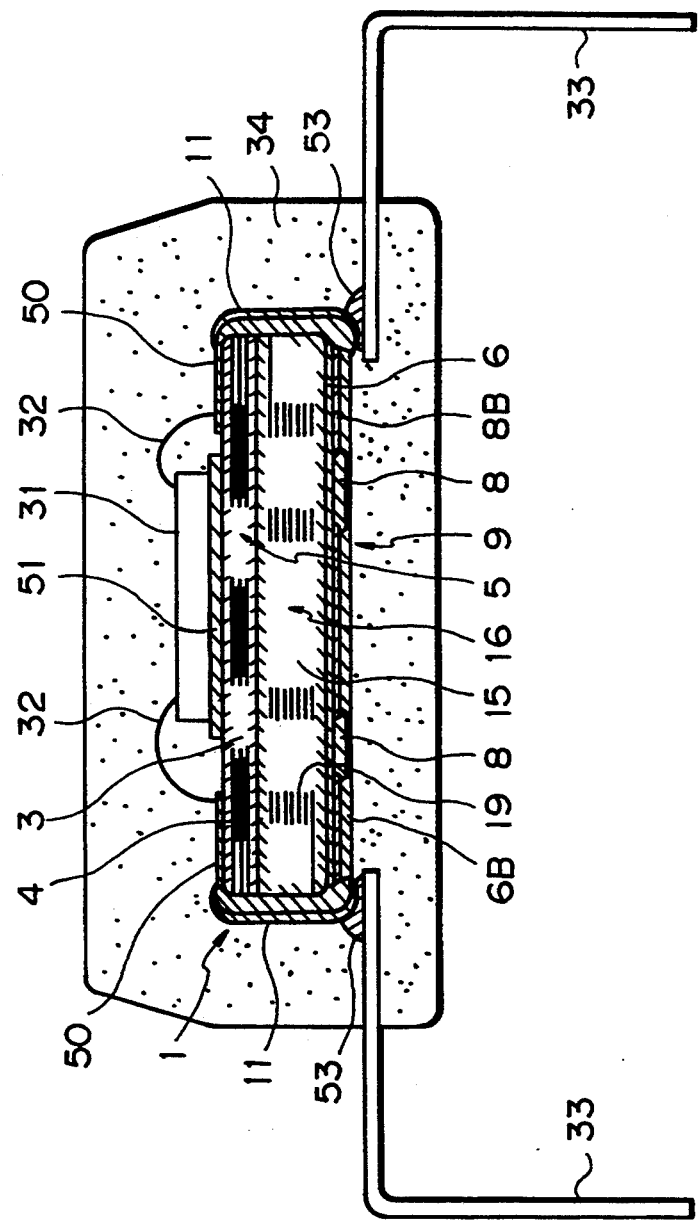

METHOD OF MAKING A MULTILAYER HYBRID CIRCUIT

This is a continuation of U.S. application Ser. No. 791,896, filed Nov. 13, 1991 now abandoned, which is a continuation of U.S. application Ser. No. 464,453 filed Jan. 12, 1990, now abandoned.

BACKGROUND OF THE INVENTION

The present invention relates to an improvement of a multilayer hybrid circuit which has a laminated printed circuit board including, at least, an inductor and/or a capacitor and/or a resistor in the printed circuit board itself.

Conventionally, electronic components are mounted on the surface of a printed circuit board, and the wiring among the components are effected through a printed wiring on the board. However, the high density mounting of electronic components requires improvements for mounting components.

The U.S. Pat. No. 4,322,698 provides one solution for high density mounting, and discloses a multilayer hybrid circuit which has a laminated printed circuit board which includes an inductor, a capacitor and/or a resistor. Since those components are produced in a board (not on the surface of the board), the size of the system can be miniaturized, and the high density mounting has become possible.

FIG. 8A and 8B show such prior multilayer hybrid circuits. In FIG. 8A, a laminated body 1A has a plurality of dielectric laminated layers 3 and a plurality of conductive films 4 so that those conductive films 4 those dielectric layers 3 compose a plurality of capacitors 5. A glass layer 6 is attached on at least one surface of the laminated body 1A, and a resistor network 9 which has a resistor layer 8 and a conductive layer 7 is attached on said glass layer 6. A printed wiring pattern 10 is deposited on at least one surface of the laminated body 1A, and a plurality of terminals 11 for external connection are deposited on the sides of the laminated body 1A. The conductive pattern 10 is used for mounting an electronic component 2 (for instance an integrated circuit, or a transistor) on the laminated body 1A. The laminated body 1A is produced through thick film printing process, and sintering process. An external electronic component 2 is soldered on the conductive pattern 10 by soldering a terminal wire 12 of the component 10 to the conductive pattern 10 by the solder 13.

In the prior structure of FIG. 8B, the laminated body 1B has not only capacitors and resistors, but also inductors 16 having an internal conductor 14 and a ferrite layer 15. In producing an inductor, a U-shaped conductive pattern 14a is printed and, next a ferrite pattern which is dielectric is deposited so that a window is kept at the one end of said U-shaped pattern 14a. Next, another U-shaped conductive pattern 14b is deposited on the ferrite pattern so that end of the pattern 14a at the window of the ferrite pattern is connected to the end of the second pattern 14b. Thus, a one turn coil is produced by a pair of U-shaped conductive patterns 14a and 14b. By repeating the above process, an inductor with a plurality of turns 14a and 14b is produced. Similarly, another inductor having U-shaped patterns 14c and 14d is produced.

However, a prior multilayer hybrid circuit has the following disadvantages.

(a) First, conventionally, a wiring between a surface component, and a capacitor 5, an inductor 16, or, a resistor 9, is effected by using a surface printed conductive pattern 10 and a side terminal 11 deposited on the surface of the laminated body. However, when a complicated external component 2 which has many external wiring pins is mounted on the board, the wiring pattern 10 must also be complicated. Thus, the area or the size of the board for the wiring pattern must be large, and sometimes that area required for wiring is larger than the area for mounting internal passive components. Further, a large number of side terminals 11 must be provided, and the insulation between the side terminals 11 is difficult when the side terminals 11 are so dense.

(b) Secondly, an external component 2 is attached on the board through conventional wiring process, and the board 1A or 1B is mounted on a mother board by soldering side terminals 11 to a printed pattern on the mother board. In the structure, the component 2 is supported by the wire 12 of the component 2 itself. However, that structure has the disadvantage that the complicated fine surface pattern 10 on the surface of the board is difficult.

(c) Further, since the structure of a multilayer hybrid circuit is so sophisticated, it is mechanically weak, and is easily damaged. In particular, when a multilayer hybrid circuit is mounted on a conventional printed mother board, a small deformation of a printed mother board would then apply a significant amount of stress to a multilayer hybrid circuit board, and damage the same.

(d) Because of the above disadvantages, the density of electronic components on a laminated hybrid circuit is limited.

SUMMARY OF THE INVENTION

It is an object, therefore, of the present invention to provide a new and improved multilayer hybrid circuit by overcoming the disadvantages and limitations of a prior multilayer hybrid circuit.

It is also an object of the present invention to provide a multilayer hybrid circuit which mounts dense components with dense wiring.

The above and other objects are attained by a multilayer hybrid circuit comprising an essentially flat-shaped laminated body which includes at least one selected from capacitor, inductor, resistor, and inner wiring portion; and a plurality of side terminals provided on side walls of said laminated body for external connection of said capacitor, said inductor, and said resistor; said capacitor being composed of a dielectric layer and conductive layers coupled with said side terminal; said inductor being composed of a magnetic layer and a plurality of U-shaped conductive layers composing a coil by sandwiching said magnetic layer between each U-shaped conductive layers; said resistor being composed of a dielectric layer and a resistor layer deposited on said dielectric layer together with a conductive layer for coupling said resistor layer with one of said side terminals; said inner wiring portion having at least one dielectric layer, a conductive pattern deposited on said dielectric layer, and a conductive through hole penetrating a dielectric layer for connecting conductive patterns on different dielectric layers, and said conductive pattern being coupled with said side terminals; and an electronic component mounted on said laminated body so that a wiring for said electronic component is effected through said inner wiring portion.

Said electronic component is preferably a bare chip, and is molded by plastics with the multilayer hybrid circuit itself.

BRIEF DESCRIPTION OF THE DRAWINGS

The foregoing and other objects, features, and attendant advantages of the present invention will be appreciated as the same become better understood by means of the following description and accompanying drawings wherein;

FIG. 3B is a cross section of FIG. 3A.

DESCRIPTION OF THE PREFERRED EMBODIMENTS

Figure 1:
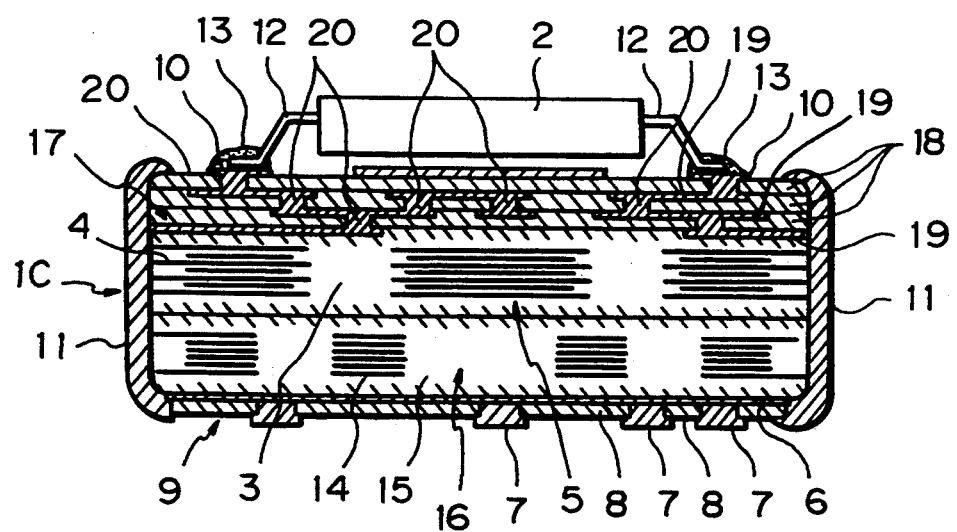
FIG. 1 shows a cross section of a multilayer hybrid circuit according to the present invention.
Figure 8A:
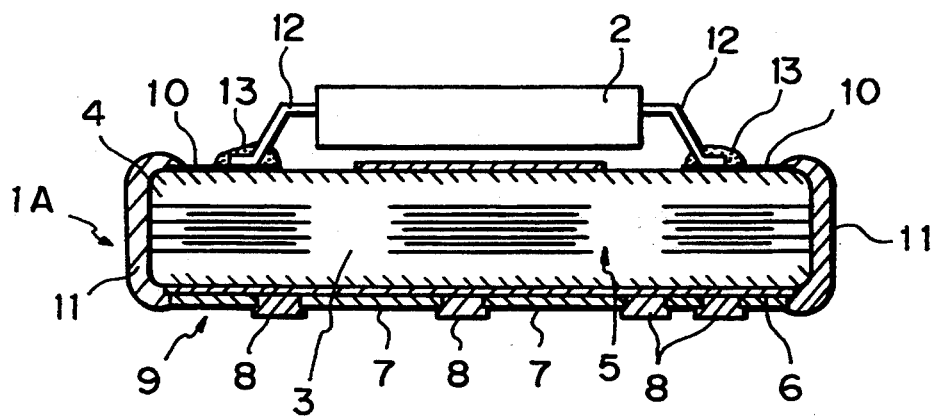
FIG. 8A is a cross section of a prior multilayer hybrid circuit.
Figure 8B:
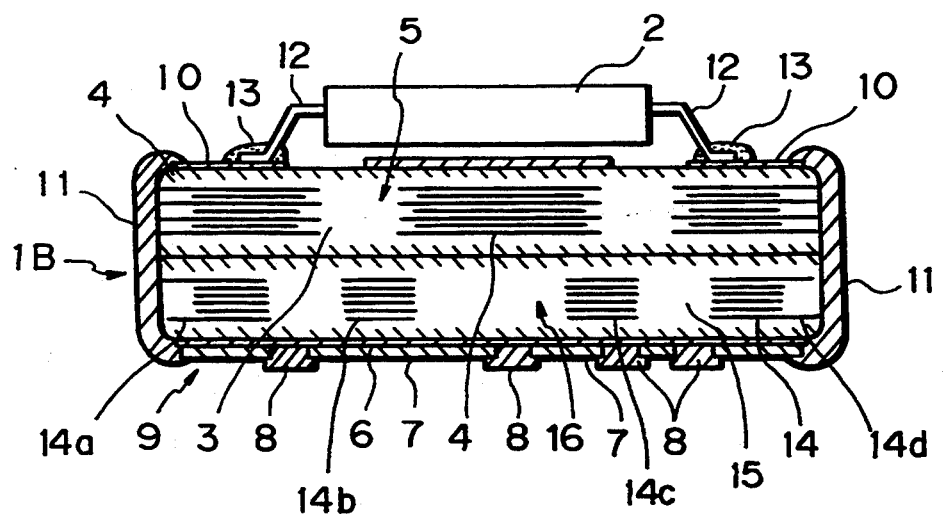
FIG. 8B is a cross section of another prior multilayer hybrid circuit.

FIG. 1 shows a cross section of the embodiment of the present multilayer hybrid circuit, in which the same reference numerals as those in FIGS. 8A and 8B show the same members. The numeral 17 is an inner wiring portion mounted on a capacitor portion 5. The inner wiring portion 17 has at least one insulation layer 18 (three insulation layers 18 are shown in FIG. 1), a flat conductive layer 19 deposited on said insulation layer 17, and a through hole 20 which penetrates through insulation layers 17 for electrically coupling said flat conductive patterns 19 on different layers. Of course, the conductive layers 19 and the through holes 20 are provided depending upon the desired wiring pattern of an electrical circuit.

The inner wiring portion 17 couples also to a surface pattern 10 to which a pin 12 of an external component 2 is connected, with a side terminal 11 to which inner passive components (an inductor, a capacitor, and/or a resistor) is connected. The conductive material for a through hole conductor 20, and a flat conductive layer 19 is Ag, Ag—Pd, or Pd. The insulation layer 18 is for instance made of ceramics, ferrite or glass. The inner wiring portion 17 is produced through thick film printing process, and a sintering process, as is the case for laminated body 1C.

Figure 2A:
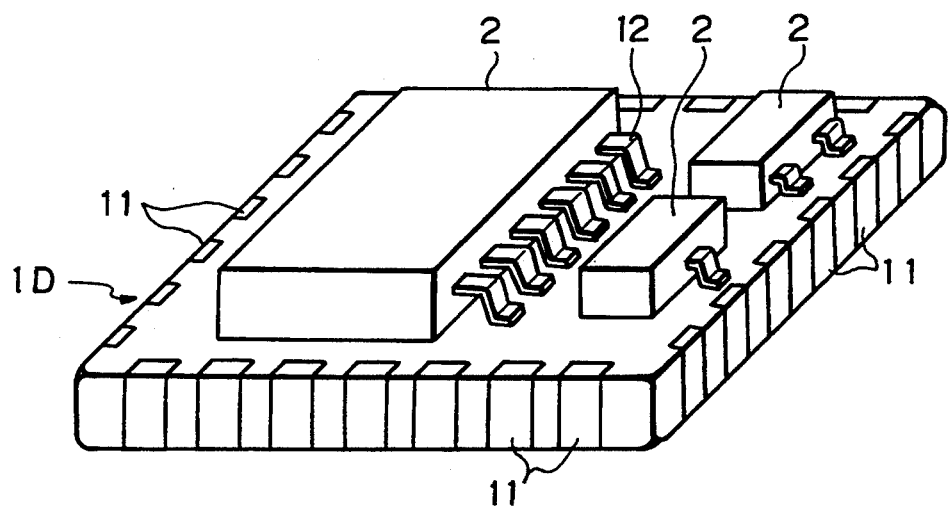
FIG. 2A is a perspective view of another embodiment of a multilayer hybrid circuit according to the present invention.

FIGS. 2 and 3 show another embodiment of the present multilayer hybrid circuit, in which a laminated body 1D has a first inner wiring portion 17A on one surface of the laminated body 1D, and a second inner wiring portion 17B on the other surface of the laminated body 1D. A plurality of external components 2 are mounted on the first surface of the laminated body 1D. The first inner wiring portion 17A effects the connection not only between external components 2 and side terminals 11, but also between the external components 2 themselves. The second inner wiring portion 17B effects the connection between the resistor network 9 and side terminals 11.

Further, it should be noted that further external components may be mounted on the second inner wiring portion 17. In that case, the connection between said further components and side terminals is effected by the second inner wiring portion 17B.

It should be appreciated that the inner wiring portion 17, 17A, or 17B is useful to connect not only between external components 2 and side terminals 11, but also between inductors, capacitors and/or resistors mounted in the laminated body. Further, the connection between an external component 2 and an inner component (an inductor, a capacitor, and/or a resistor) is effected by the inner wiring portion 17, without using side terminals 11.

It should be noted that the layers are classified to an inner wiring portion, a capacitor portion, an inductor portion, and a resistor portion in the thickness direction of the layers. The latter three portions can include a plurality of electronic components in each portion.

Figure 3A:
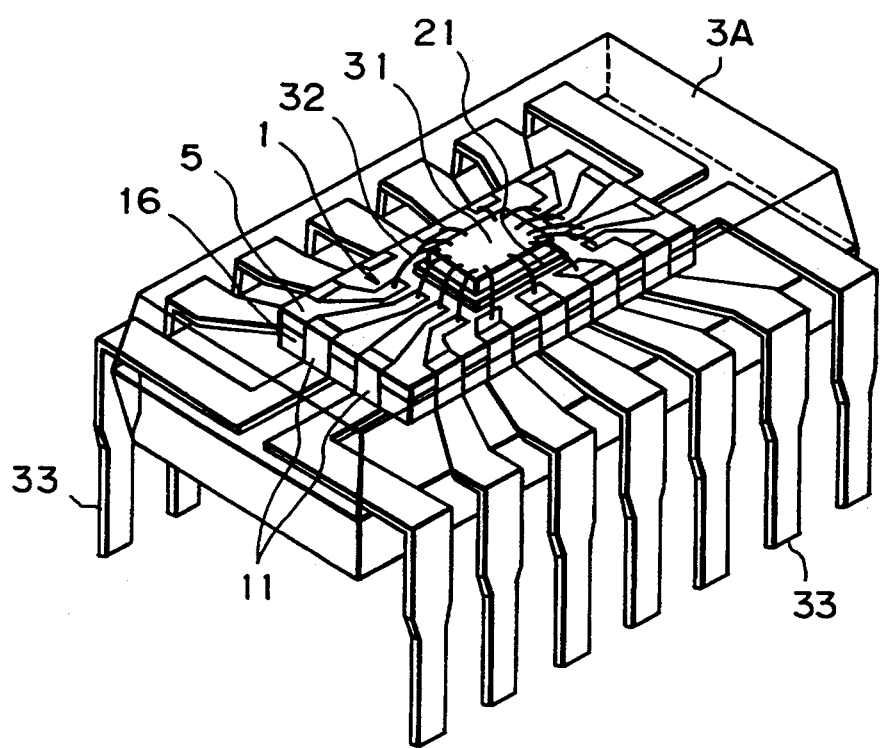
FIG. 3A is a perspective view of still another embodiment of a multilayer hybrid circuit according to the present invention.

FIGS. 3A and 3B show another embodiment of the multilayer hybrid circuit according to the present invention, and FIG. 3A is a perspective view and FIG. 3B is a cross section of FIG. 3A.

In those figures, the numeral 1 shows a laminated body which is similar to that of 1C in FIG. 1, and 1D in FIG. 2. The laminated body 1 has a capacitor 5 and/or an inductor 16. The laminated body 1 may also include a resistor and/or an inner wiring portion. The capacitor 5 is produced by laminating a dielectric layer 3 and a conductive film 4, and an terminal of each capacitor is coupled with a side terminal 11 for external connection. An inductor 16 is produced by a ferrite layer 15 and a conductive layer 19 through thick film printing process so that conductive film 19 forms a coil. It should be appreciated that a transformer is also possible by arranging conductive layer and ferrite layer in a laminated body.

A resistor network 9 is provided on the rear portion of the body 1. The resistor network 9 comprises a resistor layer 8 and a conductive layer 8B deposited on a glass layer 6 which is provided on the rear portion of the body 1. The resistor network 9 is covered with the glass layer 6B for protection purposes. The resistor network may be provided on both the surfaces of the laminated body 1, although FIG. 3B shows the case where the resistor network is provided on only the rear surface of the laminated body 1. The numeral 50 is a pad provided on a surface of the body 1 for bonding of an IC.

The laminated body 1, the resistor network 9, the pad 50 and the side terminal 11 are sintered at about 800° C.

The numeral 51 shows a conductive film which is deposited on the sintered laminated body 1, and the numeral 31 is a bare chip adhered on said conductive film 51. The bare chip 31 is for instance a semiconductor or an integrated circuit bare chip. The conductive film 51 is produced through a thick film printing process, an evaporation process, or sputtering process of metal (silver, copper, aluminium, molybudenum, gold, or palladium).

The bare chip 31 is fixed on the laminated body through the steps of printing conductive paste on the laminated body 1 through thick film printing process, placing a bare chip 31 on said paste, and heating the body at 150°–160° C. That process provides the conductive film and the adhesion of a bare chip simultaneously. The numeral 32 is a conductive wire made of gold for bonding a bare chip 31 to a pad 50. It should be noted that bare chips may be mounted on both the surfaces of the laminated body 1, although FIG. 3 shows the case that a bare chip is mounted on only one surface of the body 1.

After the bare chip 31 is mounted on the laminated body 1, the laminated body 1 is placed on a lead frame so that a side terminal 11 is placed on a proper lead terminal 33 of a lead frame. The side terminal 11 of the laminated body 1 is conductively fixed to the lead terminal 33 of the lead frame by using conductive paste or solder 53. Then, the laminated body 1 is molded by plastics 4 which covers the laminated body 1, the bare chip 31, the bonding wire 32, and a part of the lead terminal 33. Finally, an outer portion (not shown) of a lead frame is removed.

The connection of the bare chip is not restricted to bonding of gold wire, but Tape Automated Bonding (TAB system) and conventional soldering are possible. Further, in some cases, the molding process by plastics may be omitted.

Figure 2B:
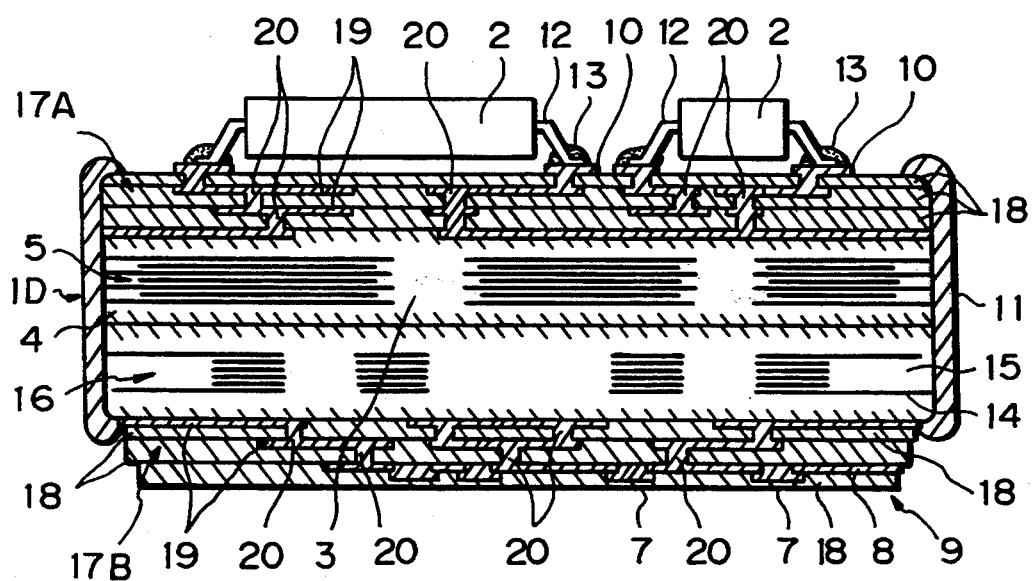
FIG. 2B is a cross section of the multilayer hybrid circuit of FIG. 2A.
Figure 4:
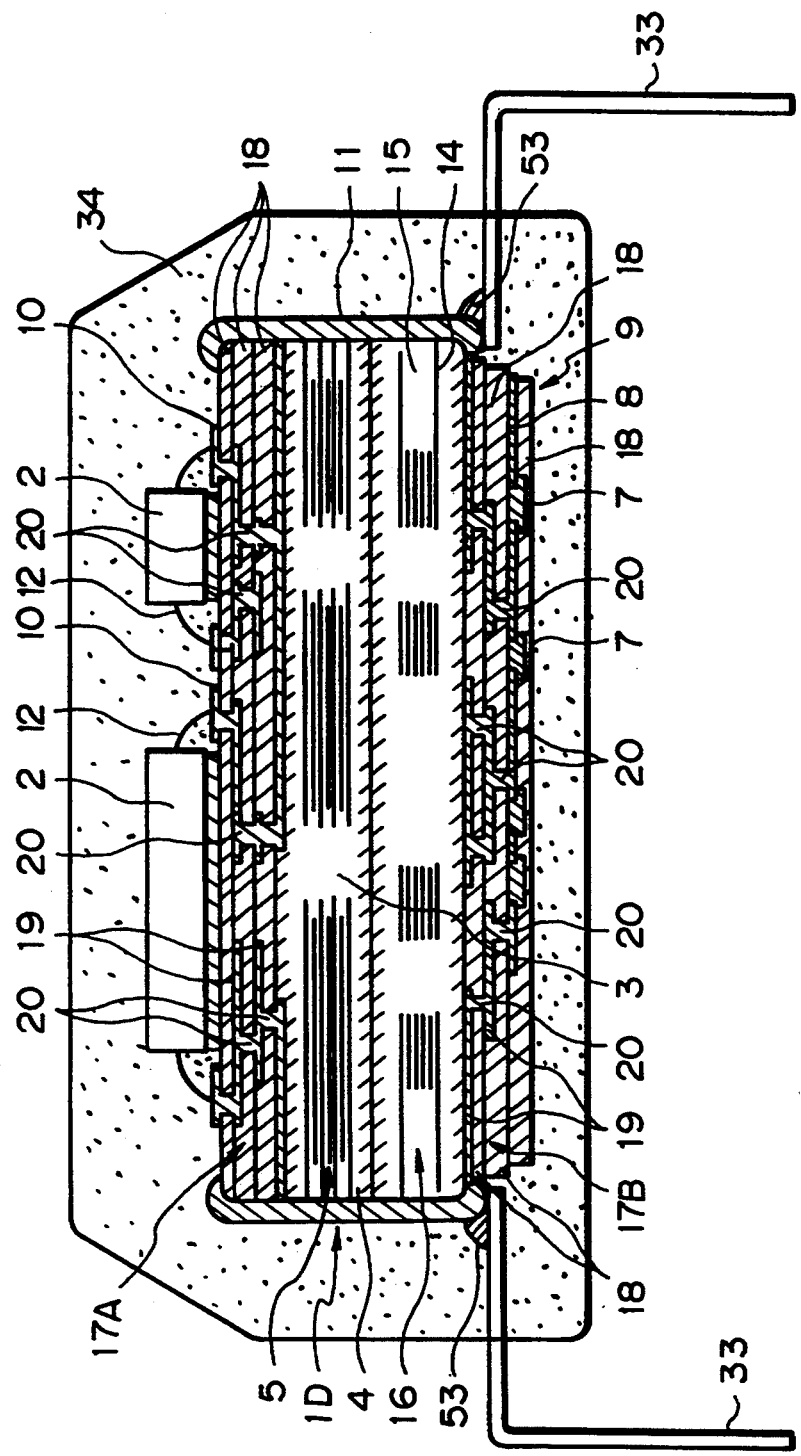
FIG. 4 shows a cross section of section of another embodiment of the multilayer hybrid circuit according to the present invention.

FIG. 4 shows another embodiment of the present invention, in which a plurality of bare chips 2 are mounted on a laminated body 1D of FIG. 2B, and the whole body including the laminated body 1D and the bare chips are molded with plastics 34, and the side terminals 11 are coupled with lead terminals 33.

In the above embodiments of FIGS. 3 and 4, a bare chip, and inner components including a capacitor, an inductor and a resistor are connected to each other through the side terminal 11, and/or an inner wiring portion.

Figure 5A:
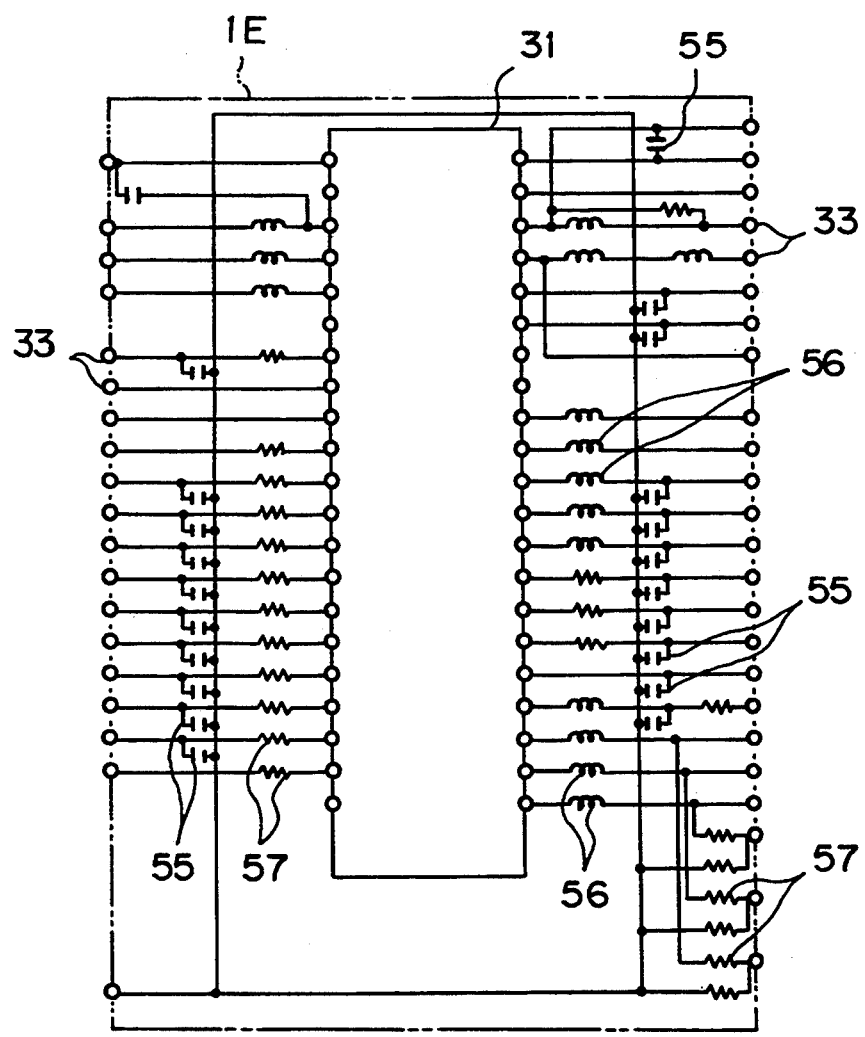
FIG. 5A is an example of a circuit diagram produced in a structure of FIGS. 3A and 3B.
Figure 5B:
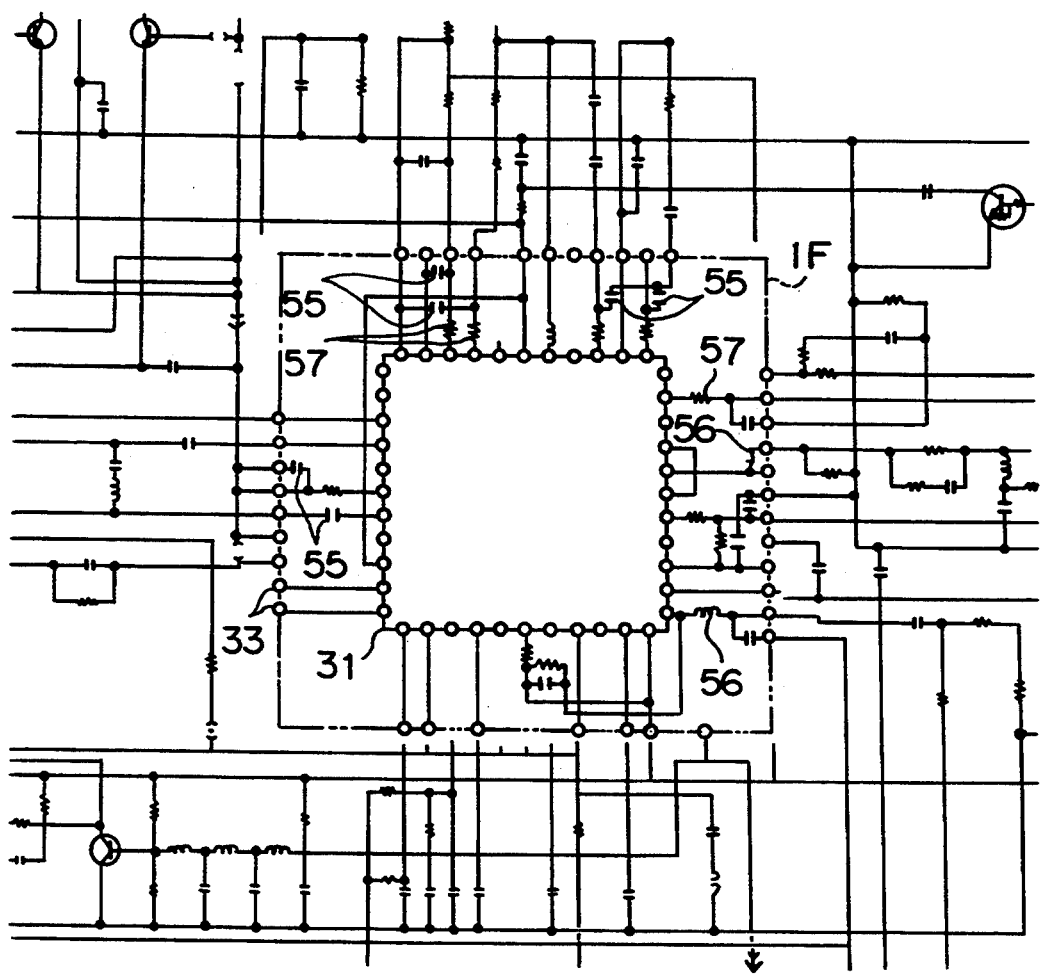
FIG. 5B is another example of a circuit diagram produced in a structure of FIGS. 3A and 3B.

FIGS. 5A and 5B show some examples of circuit diagrams of the hybrid circuit according to the present invention, in which a bare chip 31 which is an active device, and passive devices including a capacitor 55, an inductor 56, and/or a resistor 57 enclosed by dotted line 1E are included in a single chip. The numeral 33 shows a lead terminal for external connection of a hybrid integrated circuit.

A bare chip 31 is fixed on a laminated body 1 directly, or through a conductive film 51. The conductive film 51 functions as a heat sink. The coefficient of heat transfer of titanium-oxide porcelain and Barium-titanate porcelain is 0.0067w/cm.°C., and 0.0028w/cm.°C., respectively. On the other hand, those values of silver and copper are 4.10w/cm.°C., and 3.80w/cm.°C., respectively. Therefore, the use of the conductive film 51 of silver or copper effects the dissipation of heat generated in a bare chip 31, and prevents the overheat or high temperature of a bare chip.

As described, the embodiments of FIGS. 3 and 4 have the feature that an active element by a semiconductor bare chip and a passive element by a laminated body are mounted in a single hybrid circuit chip, which is molded together. Therefore, it is not necessary to mount passive elements on a printed circuit board which mounts a semiconductor chip, and the number of components is considerably reduced. Further, no printed pattern on a printed circuit board for coupling an active element and a passive element is necessary, and therefore, the structure of a printed pattern is simplified.

Figure 6A:
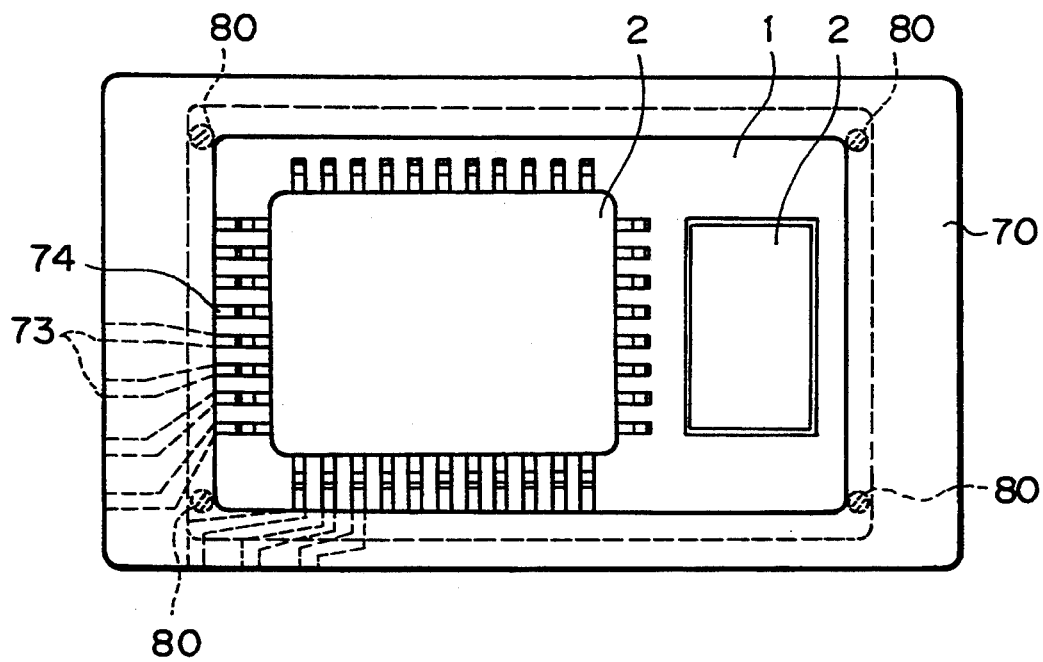
FIG. 6A is a plane view of still another embodiment of the present invention.
Figure 6B:
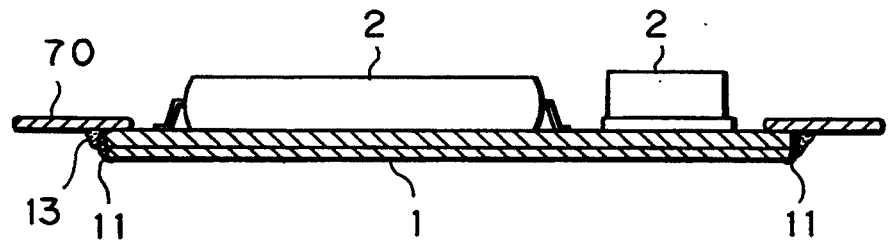
FIG. 6B is a side cross section of FIG. 6A.
Figure 6C:
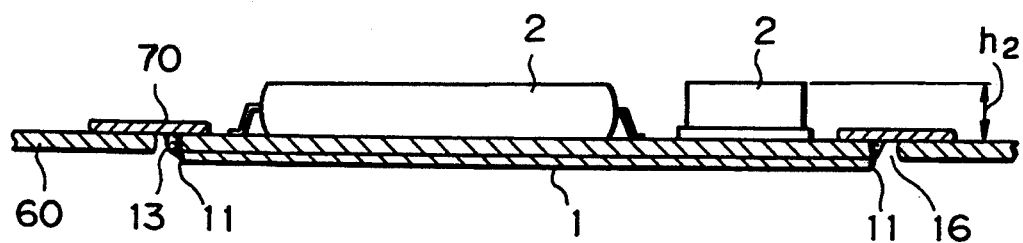
FIG. 6C is a side cross section of FIG. 6A, and shows the mounting of the multilayer hybrid circuit to a mother board.
Figure 6D:
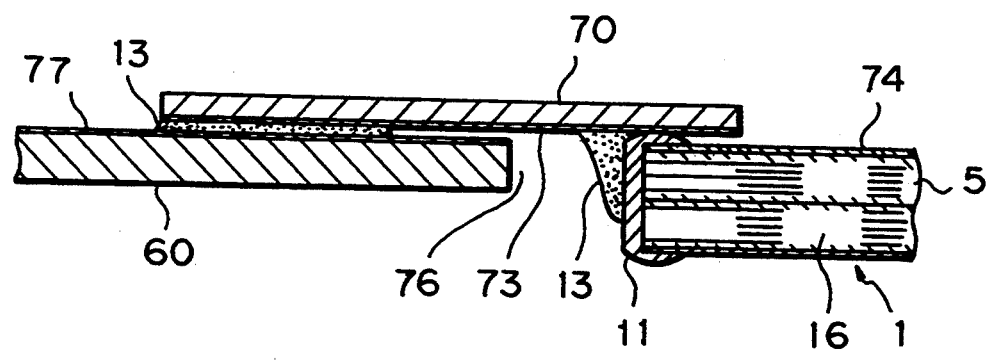
FIG. 6D is a partially enlarged view of FIG. 6C.

FIGS. 6A and 6B show another embodiment of the present invention. FIG. 6A shows a plan view, FIG. 6B shows a cross section of the same, FIG. 6C shows the cross section of FIG. 6A and shows the connection to a mother board, and FIG. 6D shows a partially enlarged view of FIG. 6C. The feature of that embodiment in FIGS. 6A through 6D is the use of a relay board 70 between a mother board 60 and a laminated body 1. The relay board 70 is made of resilient plastics board 70 and conductive patterns 73 printed on that relay board 70.

The relay board 70 has a hole or a window which relates to a laminated body 1. Therefore, the shape of the relay board 70 is ring-shaped. The conductive pattern 73 on the relay board 70 is soldered to the related conductive pattern 74 or the side terminal 11 of the laminated body 1 through the solder 13. The window of the relay board 70 is preferably a little smaller than the area of the laminated body 1, so that the laminated body 1 is placed on the ring-shaped relay board 70.

The mother board 60 has a window 76 which is a little larger than the area of the relay board 70 so that the relay board 70 is positioned in that window with a small spacing (for instance that spacing is 0.2 mm). The conductive pattern 73 on the relay board 70 is connected to the conductive pattern 77 on the mother board 60 through the solder 13. The laminated body 1 is preferably fixed to the relay board 70 by using adhesive 80 so that the laminated body 1 is positioned correctly during the soldering operation.

When a laminated body 1 is mounted on a mother board through a relay board which is resilient, even if a stress is applied to a mother board, said stress is absorbed by the resilient relay board, and no stress is applied to the laminated body 1, and further, no excessive stress is applied to the solder and therefore the connection by solder is not damaged.

Because of the presence of a window 76 of a mother board, the height h2 between the top of a component and the surface of the mother board may be lower than that when no window is provided. Of course, a mother board with no window is possible if that height of a component is not problem.

FIGS. 7A and 7B show the modification of the embodiment of FIGS. 6A through 6D. The feature of FIGS. 7A and 7B is that a laminated body 1 is fixed to a mother board 60 upside down.

Figure 7:
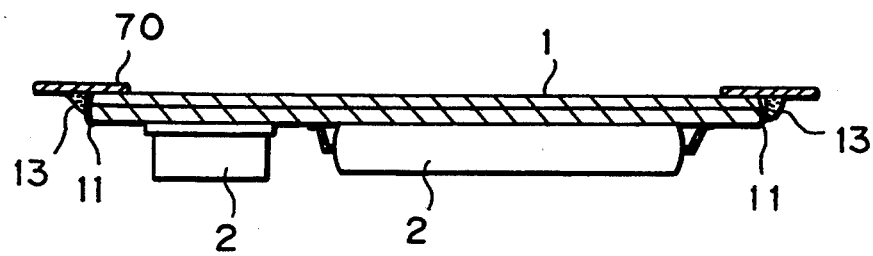
FIG. 7A is a cross section of still another embodiment of the present invention.
FIG. 7B is a partially enlarged view of FIG. 7A.
Figure 7:
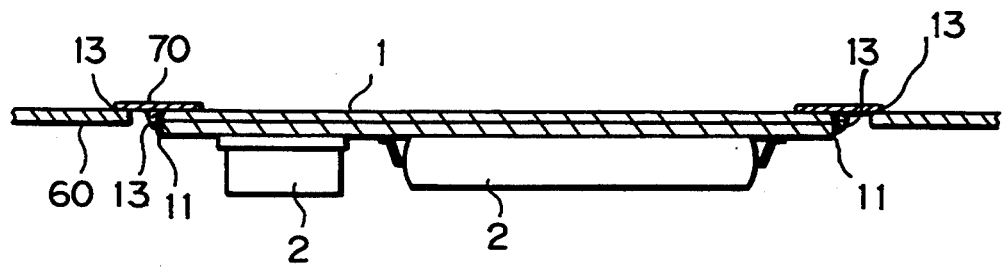

A laminated body in the embodiments of FIGS. 6 and 7 may be that which has an inner wiring portion, that which has no inner wiring portion, or that of FIG. 3 which is molded with a semiconductor bare chip. Further, a laminated body in FIGS. 6 or 7 may mount semiconductor chips on both the surfaces of the same, although the drawings of FIGS. 6 and 7 show a laminated body which has a semiconductor chip 2 on only one surface.

From the foregoing it will now be apparent that a new and improved multilayer hybrid circuit has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. A method for producing a multi-layer hybrid circuit comprising the steps of;

providing a laminated body having a plurality of passive elements including at least one selected from a capacitor layer and an inductor layer, and also including a resistor layer, said capacitor layer being produced by laminating a plurality of dielectric layers and conductive layers through thick film process so that said layers provide at least one capacitor, said inductor layer being produced by laminating a plurality of magnetic layers and U-shaped conductive layers through thick film process so that the combination of said U-shaped layers provide a coil and the combination of said coil and said magnetic layers provide an inductor, said resistor layer being produced by attaching an insulating layer on one surface of said laminated body which has at least one of said capacitor layer and said inductor layer, and attaching a resistive layer and conductive layer on said insulation layer through thick film process so that said resistor layer provides at least one resistor, laminating an inner wiring portion on said laminated body by laminating a plurality of insulation layers and flat conductive layers, said insulation layers having through holes for electrically coupling said conductive layers on different layers of said inner wiring portion to couple at least two of said passive elements, attaching a plurality of side terminals on sides of said laminated body for external connection of said passive elements and internal connection between said passive elements, and sintering said laminated body at about 800° C., all of the steps prior to the last step being performed without baking of the circuit being produced.

2. A method for producing a multi-layer hybrid circuit according to claim 1, further comprising the steps of depositing a conductive film on one surface of said laminated body through thick film printing process, adhering an integrated circuit bare chip, heating the laminated body at 150 –160 C., placing the laminated body on a lead frame so that each of said side terminals couples with each lead terminal of said lead frame, molding the laminated body together with said bare chip with plastics, and removing the outer portion of said lead frame.

* * * * *